(12) United States Patent
Park et al.

(10) Patent No.: US 10,311,199 B2
(45) Date of Patent: Jun. 4, 2019

(54) PATTERN MATCHING USING EDGE-DRIVEN DISSECTED RECTANGLES

(71) Applicant: Mentor Graphics Corporation, Wilsonville, OR (US)

(72) Inventors: Jea Woo Park, Wilsonville, OR (US); Robert A. Todd, Tigard, OR (US)

(73) Assignee: Mentor Graphics Corporation, Wllsonville, OR (US)

( * ) Notice: Subject to any disclaimer, the term of this patent is extended or adjusted under 35 U.S.C. 154(b) by 0 days.

(21) Appl. No.: 15/201,291

(22) Filed: Jul. 1, 2016

(65) Prior Publication Data

US 2018/0004888 A1      Jan. 4, 2018

(51) Int. Cl.
 *G06F 17/50* (2006.01)
 *G06T 7/60* (2017.01)
 *G06T 7/00* (2017.01)
 *G06T 7/12* (2017.01)
 *G06F 9/455* (2018.01)

(52) U.S. Cl.
 CPC ........ *G06F 17/5081* (2013.01); *G06T 7/0006* (2013.01); *G06T 7/12* (2017.01); *G06T 7/60* (2013.01); *G06T 2207/30148* (2013.01)

(58) Field of Classification Search
 USPC .................................. 716/112, 51, 52, 110
 See application file for complete search history.

(56) References Cited

U.S. PATENT DOCUMENTS

| 7,818,707 | B1 | 10/2010 | Gennari et al. | |
| 2006/0277520 | A1* | 12/2006 | Gennari | G03F 7/706 716/53 |
| 2007/0234246 | A1* | 10/2007 | Sinha | G06F 17/5068 716/52 |
| 2010/0185994 | A1 | 7/2010 | Pikus et al. | |

OTHER PUBLICATIONS

Jea Woo Park et al., "Geometric Pattern Match using edge Driven Dissected rectangles and Vector Space", poster 300.58, 51st Design Automation Conference (DAC), San Francisco, CA, Jun. 1-5, 2014.
Y.-T. Yu, "Accurate process-hotspot detection using critical design rule extraction", Design Automation Conference (DAC), 2012 49th ACM/EDAC/IEEE, pp. 1167-1172.
H.-Y. Su, "A novel fast layout encoding method for exact multilayer pattern matching with prufer encoding," Computer-Aided Design of Integrated Circuits and Systems, IEEE Transactions, vol. 34, pp. 95-108, 2015.

\* cited by examiner

*Primary Examiner* — Brian Ngo

(57) ABSTRACT

Aspects of the disclosed technology relate to techniques of pattern matching. Matching rectangles in a layout design that match rectangle members of a search pattern are identified based on edge operations. The rectangle members comprise an origin rectangle member and one or more reference rectangle members. Grid element identification values are attached to the matching rectangles. The matching rectangles that match the one or more reference rectangle members in neighborhoods of the matching rectangles that match the origin rectangle member are then analyzed. The neighborhoods are determined based on the grid element identification values. Based on the analysis, matching patterns in the layout design that match the search pattern are determined.

20 Claims, 16 Drawing Sheets

```
procedure EDDR-PM(P1, P2, ...., Pn, nonMem, PDB)
    Inputs (P1..n, nonMem, and PDB) are the same as Algorithm 1.
    ADD_BIN for each member from P1 to Pn.
    LOCATE_BIN for all the origin members of P1 and get bin_counts
    for i = 1 → bin_counts for p_i in P1 bins  do
        LOCATE_BIN a reference member, p2, in P2 bins by searching
        the vector distance between P1's center and P2'2 center.(PDB has this info.)
        if found then
            if the found p2 a valid reference member then
                Create a bounding box using d1, d2, d3, and d4 determind by
                vector info between P1 and the found P2's center.
            else
                No match. continue to next p1 in P1
            if nomMem exists inside the bounding box then
                No match. continue to next p1 in P1
            LOCATE_BIN for other members inside the bounding box.
                for each member inside the bounding box do
                    n = number of each member inside bounding box
                    m = number of each memeber described in PDB
                    if n != m then
                        No match. continue to next p1 in P1
                    if valid member == false then
                        No match. continue to next p1 in P1
                Matching pattern found at this point.
                Output the bounding box to indicate the match.
                continue to next p1 in P1
        else
            No match. continue to next p1 in P1
```

FIG. 12

```
procedure EDDR-PM(P1, P2, ...., Pn, nonMem, PDB)
    Inputs (P1..n, nonMem, and PDB) are the same as Algorithm 1.
    ADD_BIN for each member from P1 to Pn.
    LOCATE_BIN for all the origin members of P1 and get bin_counts
    for i = 1 → bin_counts for p_i in P1 bins do
        LOCATE_BIN a reference member, p2, in P2 bins by searching
        the vector distance between P1's center and P2'2 center.(PDB has this info.)
        if found then
            if the found p2(reference member) is fuzzy member then
                Create one of 8 bounding boxes using 8 different d1, d2, d3,
                and d4 sets stored in PDB.
                Iterate 8 times from step(19) to step(35).
            else
                if the found p2 a valid reference member then
                    Create a bounding box using d1, d2, d3, and d4 determind by
                    vector info between P1 and the found P2's center.
                else
                    No match. continue to next p1 in P1
            if nomMem exists inside the bounding box then
                No match. continue to next p1 in P1
            LOCATE_BIN for other members in P3 ··· P_n
            inside the bounding box.
            for each member inside the bounding box do
                n = number of each member inside bounding box
                m = number of each memeber described in PDB
                if n != m then
                    No match. continue to next p1 in P1
                if member is fuzzy member then
                    skip member validation check
                else
                    if valid member == false then
                        No match. continue to next p1 in P1
            Matching pattern found at this point.
            Output the bounding box to indicate the match.
            continue to next p1 in P1
        else
            No match. continue to next p1 in P1
```

FIG. 16

PATTERN MATCHING USING EDGE-DRIVEN DISSECTED RECTANGLES

FIELD OF THE DISCLOSED TECHNOLOGY

The present disclosed technology relates to integrated circuit design and process technologies. Various implementations of the disclosed technology may be particularly useful for pattern matching.

BACKGROUND OF THE DISCLOSED TECHNOLOGY

Designing and fabricating integrated circuit devices typically involves many steps, sometimes referred to as the "design flow." Typically, software and hardware "tools" verify the design at various stages of the design flow by running software simulators and/or hardware emulators. These steps aid in the discovery of errors in the design, and allow the designers and engineers to correct or otherwise improve the design. Many of these steps are extremely time consuming, taking up to several days for just one simulation, and a circuit layout design will make many iterations through each of the different phases, passing back further up in the flow to try again after a problem is discovered. Pattern matching provides approximate, but fast evaluation of sensitivities of a layout to lithographic effects and helps reduce the number of iterations through the flow.

Some pattern matching methods are DRC (Design Rule Checking)-based. In a DRC-based pattern matching process, a pattern to be searched (search pattern) is converted into a set of DRC rules first, the layout design is then checked using the set of DRC rules, and finally the output is analyzed to obtain pattern matches. While faster and more accurate than other approaches, existing DRC-based methods tend to generate a large number of complex DRC rules. The complex DRC rules not only are difficult for users to understand but can also cause high computation costs. Moreover, fuzzy pattern matching or partial pattern matching is difficult to implement using the complex DRC rules. It is thus desirable to develop a new DRC-based method that can address these shortcomings.

BRIEF SUMMARY OF THE DISCLOSED TECHNOLOGY

Aspects of the disclosed technology relate to techniques of pattern matching. In one aspect, there is a method comprising: identifying matching rectangles in a layout design that match rectangle members of a search pattern based on edge operations and a first set of criteria, the rectangle members comprising an origin rectangle member and one or more reference rectangle members; attaching grid element identification values to the matching rectangles, the grid element identification values being associated with a regular grid that divides the layout design into a number of equal rectangle regions (grid elements); determining matching patterns in the layout design that match the search pattern based on a second set of criteria, the determining comprising analyzing the matching rectangles that match the one or more reference rectangle members in neighborhoods of the matching rectangles that match the origin rectangle member, wherein the neighborhoods are determined based on the grid element identification values; and storing the matching patterns.

It should be noted that the rectangle members may comprise members that are square-shaped. It should also be noted that the grid elements may be square-shaped. The regular grid may be an adaptive grid. Size of the grid element may be adjusted to be comparable to size of a bounding box of the search pattern The determining may comprise: identifying a first matching rectangle that not only matches one of the reference rectangle members but also has a distance from a second matching rectangle that matches the origin rectangle member the same as that of the search pattern; constructing a bounding box based on the first matching rectangle and the second matching rectangle; and determining whether the bounding box encloses the matching rectangles that match the rest of the reference rectangle members.

In another aspect, there is one or more computer-readable media storing computer-executable instructions for causing one or more processors to perform the above method.

In still another aspect, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIG. 12 illustrates an example of a pattern matching algorithm for exact match that may be employed according to various embodiments of the disclosed technology.

FIG. 16 illustrates an example of a fuzzy pattern matching algorithm that may be employed according to various embodiments of the disclosed technology.

DETAILED DESCRIPTION OF THE DISCLOSED TECHNOLOGY

Figure 1:
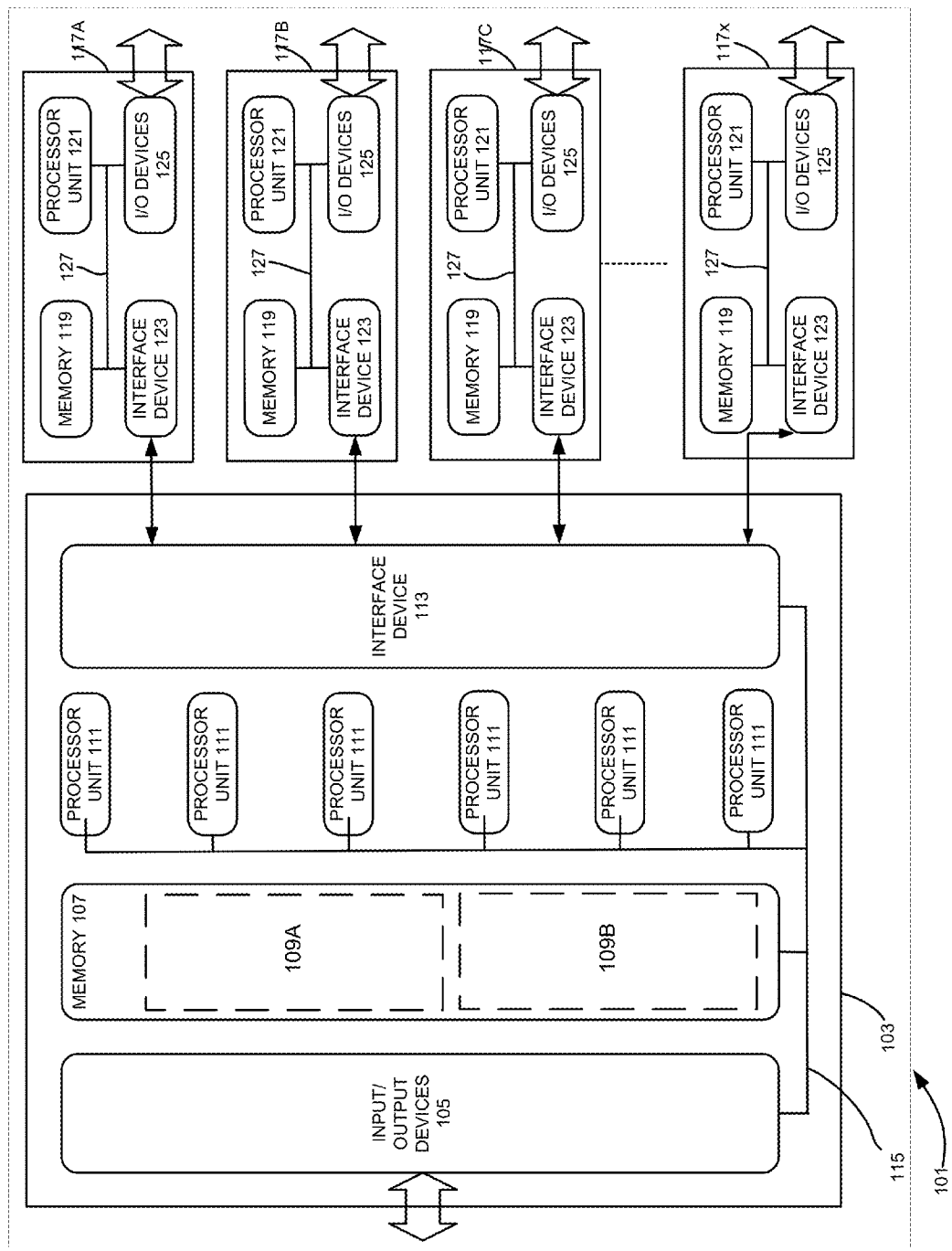
FIG. 1 illustrates an example of a computing system that may be used to implement various embodiments of the disclosed technology.

Various aspects of the present disclosed technology relate to techniques of pattern matching. In the following description, numerous details are set forth for purpose of explanation. However, one of ordinary skill in the art will realize that the disclosed technology may be practiced without the use of these specific details. In other instances, well-known features have not been described in detail to avoid obscuring the present disclosed technology.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "identify", "attach", and "determine" to describe the disclosed methods. These terms are high-level abstractions of the actual operations that are performed. The actual operations that correspond to these terms may vary depending on the particular implementation and are readily discernible by one of ordinary skill in the art.

Any of the disclosed techniques can be implemented in whole or in part by software comprising computer-executable instructions stored on computer-readable media. Such software can comprise, for example, an appropriate electronic design automation ("EDA") software tool. Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For example, the disclosed technology can be implemented using any commercially available computer executing a program written in any commercially available or otherwise suitable language. Any of the disclosed methods can alternatively be implemented (partially or completely) in hardware (e.g., an ASIC, PLD, or SoC).

Any data produced from any of the disclosed methods (e.g., intermediate or final test patterns, test patterns values, or control data) can be stored on computer-readable media (e.g., tangible computer-readable media, such as one or more CDs, volatile memory components (such as DRAM or SRAM), or nonvolatile memory components (such as hard drives)) using a variety of different data structures or formats. Such data can be created, updated, or stored using a local computer or over a network (e.g., by a server computer).

As used in this disclosure, the singular forms "a," "an," and "the" include the plural forms unless the context clearly dictates otherwise. Additionally, the term "includes" means "comprises." Moreover, the term "design" is intended to encompass data describing an entire microdevice, such as an integrated circuit device or micro-electromechanical system (MEMS) device. This term also is intended to encompass a smaller group of data describing one or more components of an entire microdevice, however, such as a layer of an integrated circuit device, or even a portion of a layer of an integrated circuit device.

Still further, the term "design" also is intended to encompass data describing more than one microdevice, such as data to be used to create a mask or reticle for simultaneously forming multiple microdevices on a single wafer. The layout design data may be in any desired format, such as, for example, the Graphic Data System II (GDSII) data format or the Open Artwork System Interchange Standard (OASIS) data format proposed by Semiconductor Equipment and Materials International (SEMI). Other formats include an open source format named Open Access, Milkyway by Synopsys, Inc., and EDDM by Mentor Graphics, Inc.

Illustrative Operating Environment

The execution of various electronic design automation processes according to embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
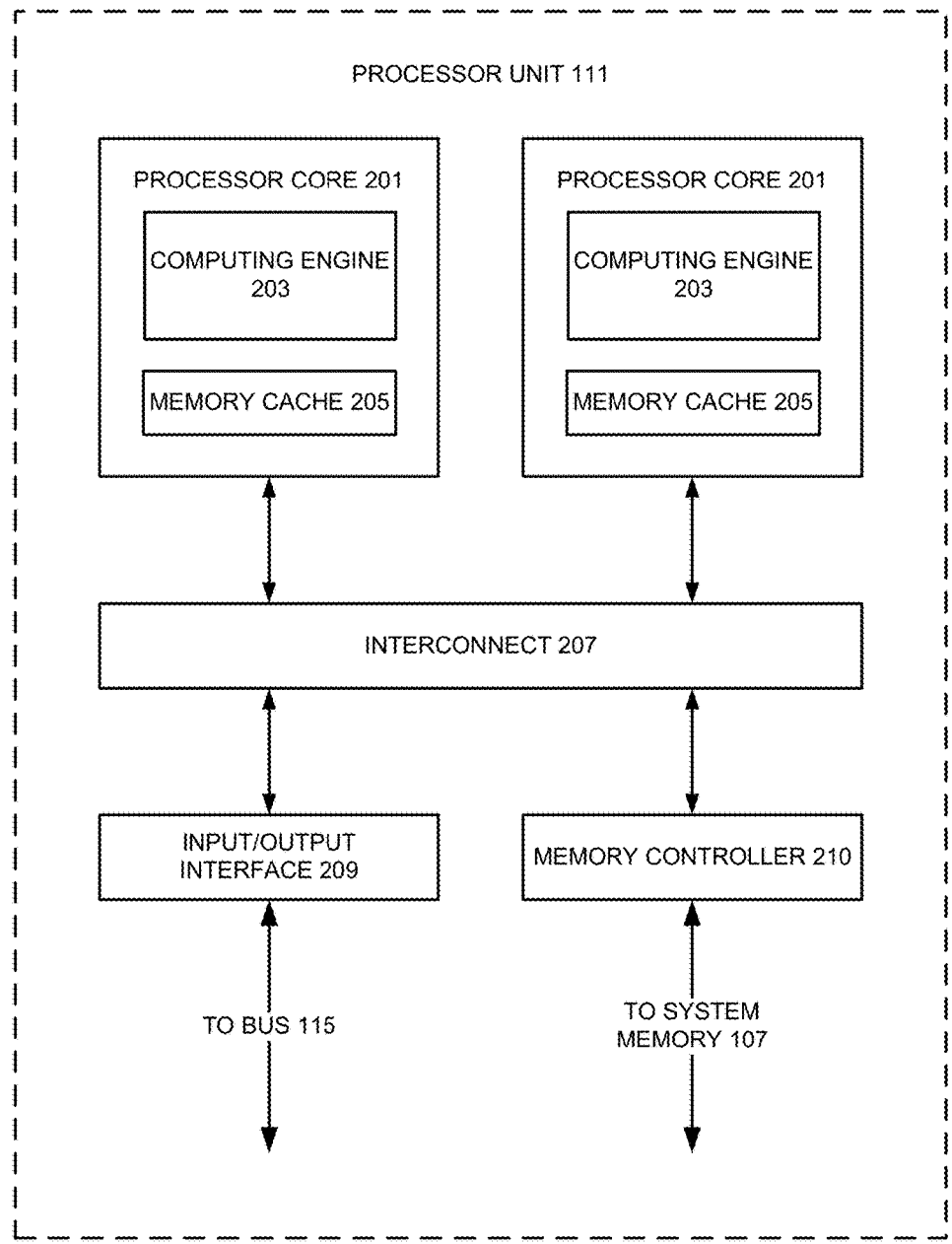
FIG. 2 illustrates an example of a multi-core processor unit that may be used to implement various embodiments of the disclosed technology.

With some implementations of the disclosed technology, the master computing device 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the disclosed technology, the processor units 111 may include additional components, such as a high-level cache memory accessible shared by the processor cores 201.

While FIG. 2 shows one illustration of a processor unit 111 that may be employed by some embodiments of the disclosed technology, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

Layout Design and Design Rule Checking

Electronic circuits, such as integrated microcircuits, are used in a variety of products, from automobiles to microwaves to personal computers. Designing and fabricating microcircuit devices typically involves many steps, sometimes referred to as the "design flow." The particular steps of a design flow often are dependent upon the type of microcircuit, its complexity, the design team, and the microcircuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design. These various microcircuits are often referred to as integrated circuits (IC's).

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing circuit device components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks.

IC layout descriptions can be provided in many different formats. The Graphic Data System II (GDSII) format is a popular format for transferring and archiving two-dimensional graphical IC layout data. Among other features, it contains a hierarchy of structures, each structure containing layout elements (e.g., polygons, paths or poly-lines, circles and textboxes). Other formats include an open source format named Open Access, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in IC layout designs that are employed to manufacture integrated circuits. Once the microcircuit device design is finalized, the layout portion of the design can be used by fabrication tools to manufacture the device using a photolithographic process.

Process variations and technical limitations of the photolithography techniques can make it difficult or even impossible to print some layout features. To achieve a high overall yield and reliability for the design, the layout is measured by a set of geometric constraints, or design rules, specific to a particular photolithographic process before tapeout. Design rule checking is thus a major step during physical verification signoff on the design.

Figure 3:
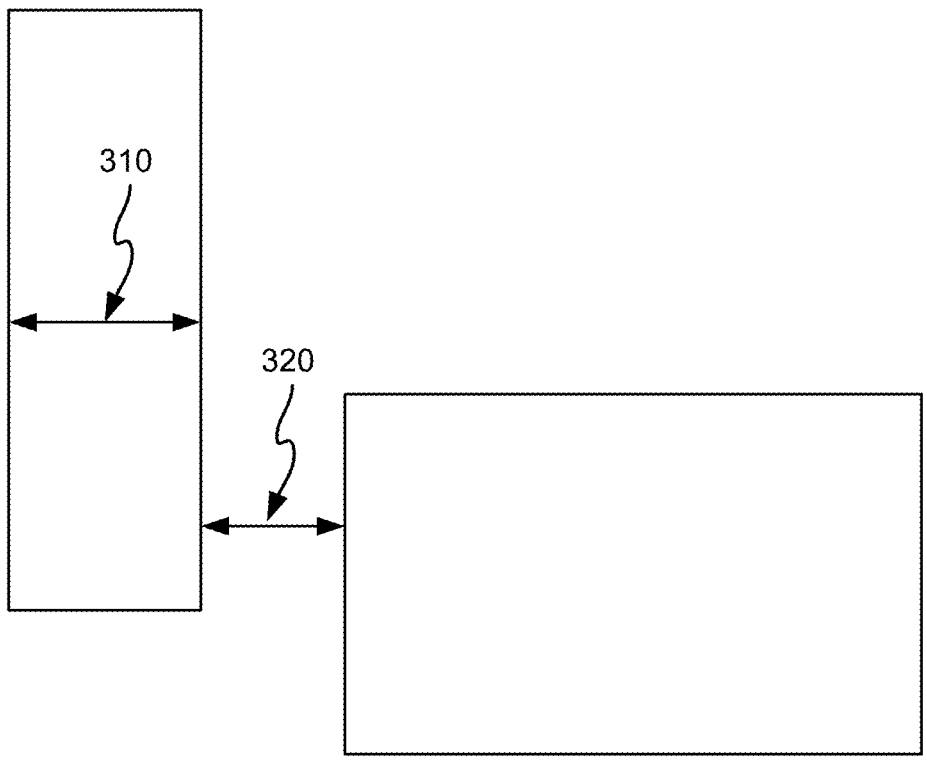
FIG. 3 illustrates design for checking rules for width and spacing.

Modern DRC rule sets are complex, but they usually include two most basic rules: width and spacing (FIG. 3). The width rule prevents pinch-off of narrow shapes by defining minimum width (see e.g., 310) for any shape. Similarly, the spacing rule prevents bridging by defining minimum distance allowed between two shapes (see e.g., 320). These rules can be expressed using constant values or equations/inequalities with variables. Violations of these rules are reported by the DRC tool by providing locations of the edges in violation. Besides these basic rules, there are many other DRC rules like area, ratio, overlap and density constraint rules. As design nodes are getting smaller and smaller, the DRC rules are getting more complicated and modern DRC tools need perform these checks efficiently.

Pattern Matching Tool

Figure 4:
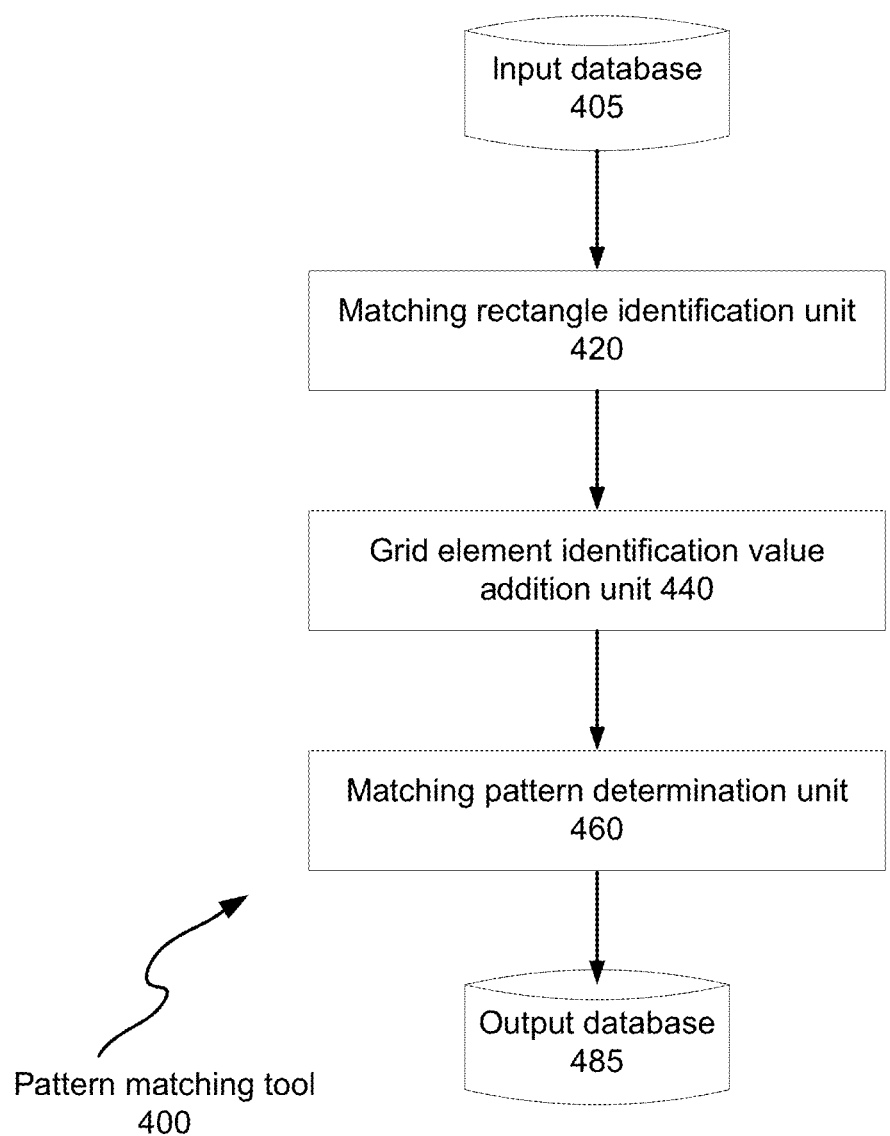
FIG. 4 illustrates an example of a pattern matching tool that may be implemented according to various embodiments of the disclosed technology.

FIG. 4 illustrates an example of a pattern matching tool 400 that may be implemented according to various embodiments of the disclosed technology. As seen in this figure, the pattern matching tool 400 includes a matching rectangle identification unit 420, a grid element identification value attaching unit 440 and a matching pattern determination unit 460. Some implementations of the pattern matching tool 400 may cooperate with (or incorporate) one or both of an input database 405 and an output database 485.

As will be discussed in more detail below, the matching rectangle identification unit 420 identifies matching rectangles in a layout design that match rectangle members of a search pattern based on edge operations and a first set of criteria. The rectangle members comprise an origin rectangle member and one or more reference rectangle members. The grid element identification value addition unit 460 then attaches grid element identification values to the matching rectangles. The grid element identification values are associated with a regular grid that divides the layout design into a number of equal rectangle regions (grid elements). Finally, the matching pattern determination unit 460 determines matching patterns in the layout design that match the search pattern based on a second set of criteria. The determining comprises analyzing the matching rectangles that match the one or more reference rectangle members in neighborhoods of the matching rectangles that match the origin rectangle member. The neighborhoods are determined based on the grid element identification values. The search pattern and the layout design may be stored in the input database 405 and the matching patterns may be stored in the output database 485.

As previously noted, various examples of the disclosed technology may be implemented by one or more computing systems, such as the computing system illustrated in FIGS. 1 and 2. Accordingly, one or more of the matching rectangle identification unit 420, the grid element identification value attaching unit 440 and the matching pattern determination unit 460 may be implemented by executing programming instructions on one or more processors in one or more computing systems, such as the computing system illustrated in FIGS. 1 and 2. Correspondingly, some other embodiments of the disclosed technology may be implemented by software instructions, stored on a non-transitory computer-readable medium, for instructing one or more programmable computers/computer systems to perform the functions of one or more of the matching rectangle identification unit 420, the grid element identification value attaching unit 440 and the matching pattern determination unit 460. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

It also should be appreciated that, while the matching rectangle identification unit 420, the grid element identification value attaching unit 440 and the matching pattern determination unit 460 are shown as separate units in FIG. 4, a single computer (or a single processor within a master computer) or a single computer system may be used to implement all of these units at different times, or components of these units at different times.

With various examples of the disclosed technology, the input database 405 and the output database 485 may be implemented using any suitable computer readable storage device. That is, either of the input database 405 and the output database 485 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 405 and the output database 485 are shown as separate units in FIG. 4, a single data storage medium may be used to implement some or all of these databases.

Pattern Matching

Figure 5:
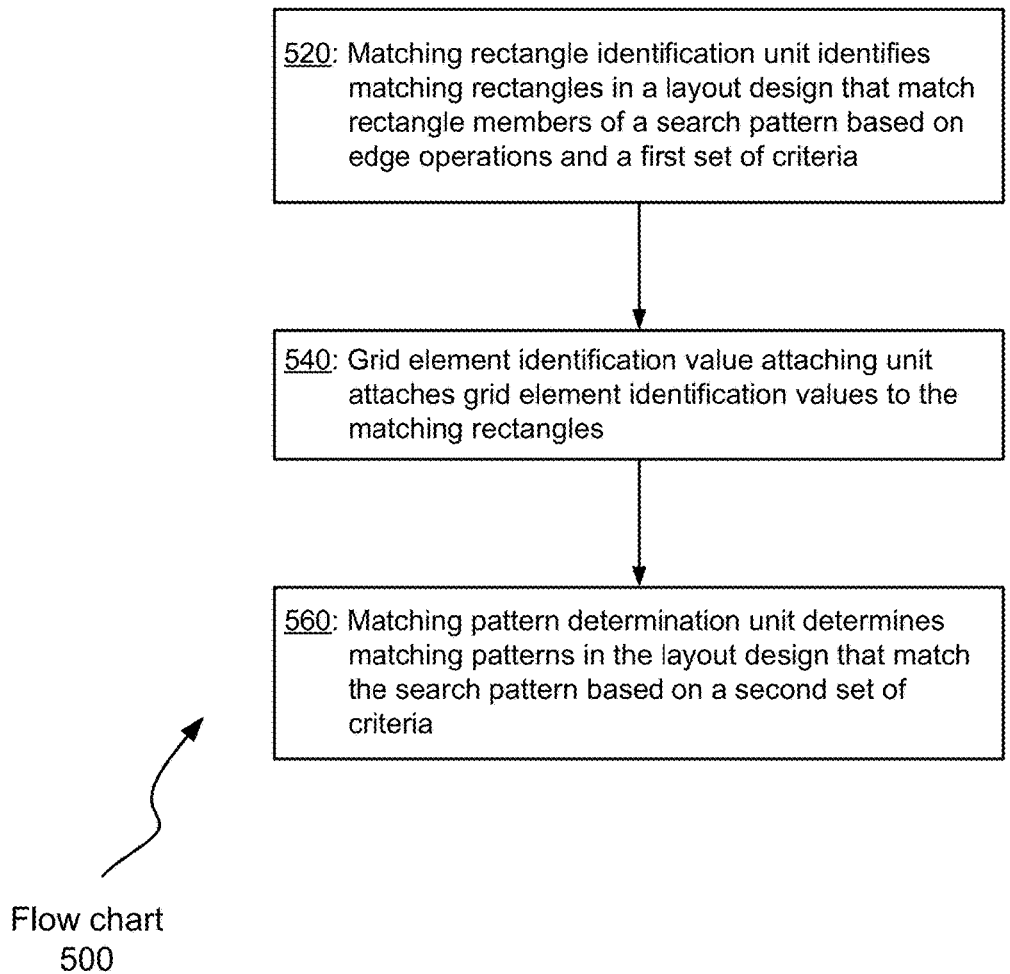
FIG. 5 illustrates a flowchart showing a process of pattern matching that may be implemented according to various examples of the disclosed technology.

FIG. 5 illustrates a flowchart 500 showing a process of pattern matching that may be implemented according to various examples of the disclosed technology. For ease of understanding, methods of pattern matching that may be employed according to various embodiments of the disclosed technology will be described with reference to the pattern matching tool 400 in FIG. 4 and the flow chart 500 illustrated in FIG. 5. It should be appreciated, however, that alternate implementations of a pattern matching tool 400 may be used to perform the methods of pattern matching illustrated by the flow chart 500 according to various embodiments of the disclosed technology. Likewise, the pattern matching tool 400 may be employed to perform other methods of pattern matching according to various embodiments of the disclosed technology.

Figure 6A:
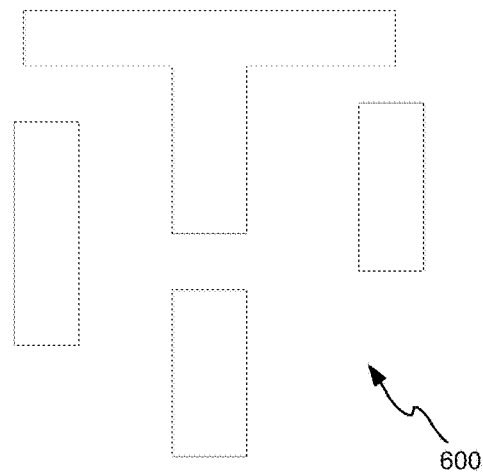
FIG. 6A illustrates an example of a search pattern 600.
Figure 6B:
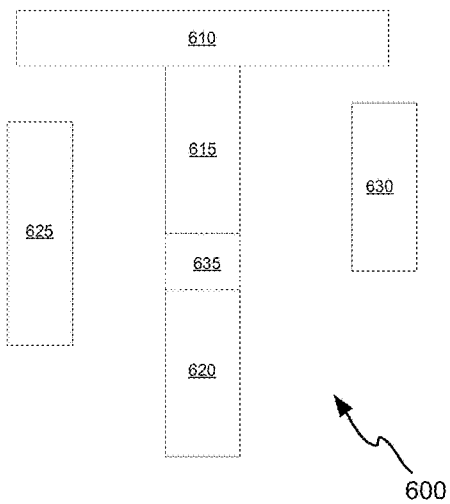
FIG. 6B illustrates one way to dissect the search pattern 600 into rectangles according to various embodiments of the disclosed technology.

In operation 520, the matching rectangle identification unit 420 identifies matching rectangles in a layout design that match rectangle members of a search pattern based on edge operations and a first set of criteria. The search pattern is divided into rectangles. The rectangles may comprise squares. FIG. 6A illustrates an example of a search pattern 600. The search pattern 600 may be dissected into rectangles 610-635 as shown in FIG. 6B according to various embodiments of the disclosed technology. This dissection may be obtained by moving a vertical scan line horizontally across the search pattern 600. The generated rectangles 610-630 belong to the origin pattern 600 while the rectangle 635 is between two layout features of the origin pattern 600. The rectangle 635 may be introduced as one of the rectangle members when, for example, the spacing between the two layout features is a critical dimension and a partial pattern matching is to be performed.

The rectangle members used in the operation 520 may include all or some of the rectangles 610-635. Any of them may serve as an origin rectangle member. The rest of the selected rectangles are referred to as reference rectangle members. The classification is used for the pattern matching operation, which will be discussed later.

Figure 6C:
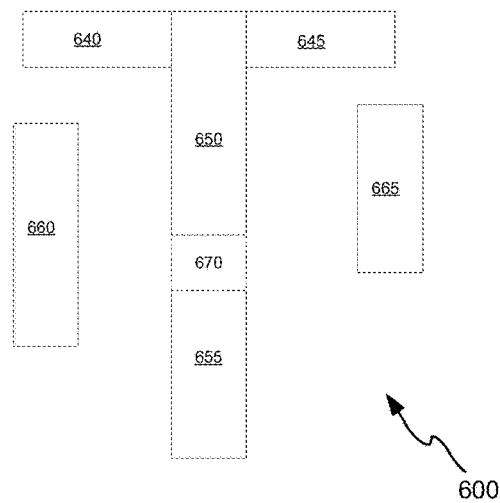
FIG. 6C illustrates another way to dissect the search pattern 600 into rectangles according to various embodiments of the disclosed technology.

FIG. 6C illustrates another way to dissect the search pattern 600 that may be employed according to various embodiments of the disclosed technology. Rectangles 640-670 may be obtained by moving a horizontal scan line vertically across the search pattern 600. The union of the three rectangles 640, 645 and 650 in FIG. 6C is the same as the union of the two rectangles 610 and 615 in FIG. 6B.

The matching rectangle identification unit 420 employs the edge operations to search for the matching rectangles that match the rectangle members of the search pattern in the layout design. An edge operation is an operation for checking edge related DRC rules. A design rule checking (DRC) tool can perform various edge operations. Some basic edge operations performed by the Calibre family of software tools available from Mentor Graphics include LENGTH, WIDTH, and SPACE.

LENGTH is an edge operation function that takes three inputs (edges of polygons, length constraint, length value) and returns edges that meet the constraint. Length constraint can be any relational operators such as $==, >=<=$, and etc. It can be expressed as: E'==LENGTH(E, RO, value), where E represent edges of polygons to be checked and E' represents edges that meet the length constraint described by RO and value.

WIDTH is an edge operation function that takes five inputs (edges of polygons, edges of polygons, all edges of layer, width constraint, width value) and measure width between the first input edges and the second input edges facing inward polygons. It returns rectangles using the edges that meet the width constraint. It can be expressed as: R==WIDTH(E1,E2,E3,R0,value), where E1, E2, and E3 represent the three input edges (E1 and E2 are subsets of E3), the width constraint is described by the relation operator RO and value, and R represents rectangles formed by edges that meet the width constraint.

SPACE is the same edge operation function as WIDTH except that it measures spacing between the first input edges and the second input edges facing outward polygons. It can be expressed as: R==SPACE(E1, E2, E3, R0, value).

Figure 7:
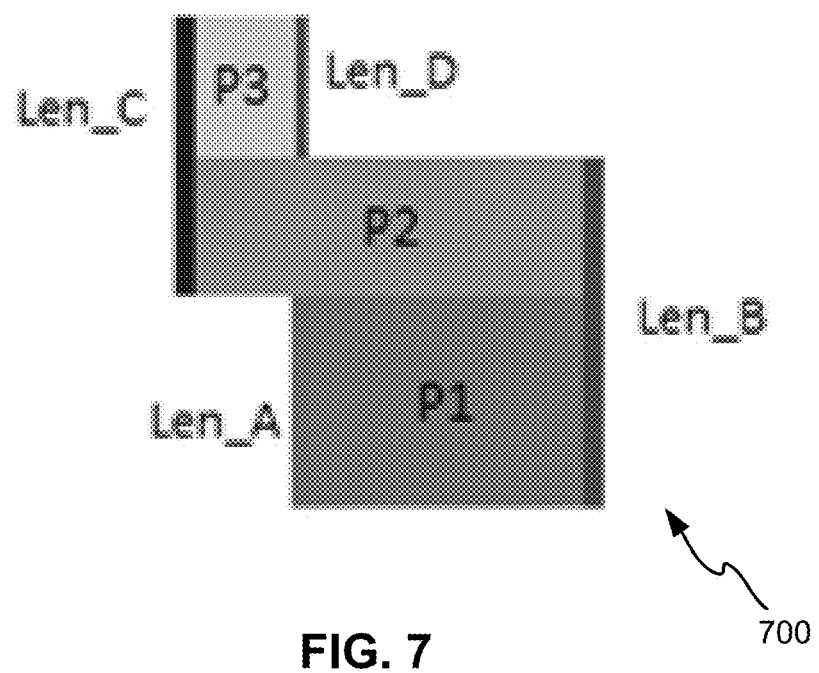
FIG. 7 illustrates a search pattern 700 which is divided into three rectangle members according to various embodiments of the disclosed technology.

FIG. 7 illustrates an example of a search pattern 700. For ease of understanding, methods employed by the matching rectangle identification unit 420 for identifying the matching rectangles that may be employed according to various embodiments of the disclosed technology will be described with reference to the search pattern 700 in FIG. 7. The search pattern 700 has three rectangle members: P1, P2 and P3. The matching rectangle identification unit 420 may first perform edge operations to identify edges in the layout design that match edges Len_A, Len_B, Len_C and Len_D, respectively. If the Calibre family of software tools is used, the commands may be written as:

Len_A==LENGTH(Metal_1,==,a),
Len_B==LENGTH(Metal_1,==,b),
Len_C==LENGTH(Metal_1,==,c),
Len_D==LENGTH(Metal_1,==,d).

In the above example, the functions return edges exact matching each of the four edges. Thus, the first set of criteria comprises criteria for exact edge matching. The first set of criteria may comprise criteria for exact edge matching, fuzzy edge matching, or both. Instances for some or all of the four edges may be defined, for example, as edges of which length values are within ranges of the lengths values of the search pattern edges.

After obtaining instances of the edges, the matching rectangle identification unit 420 may determines the matching rectangles by width/spacing operations. If the Calibre family of software tools is used, the commands may be written as:

P1==WIDTH(Len_A,Len_B,Metal_1,==,w1),
P2==WIDTH(Len_C,Len_B,Metal_1,==,w2),
P3==WIDTH(Len_C,Len_D,Metal_1,==,w3).

Again, the first set of criteria used in the above example comprises criteria for exact width matching. The first set of criteria may comprise criteria for exact width matching, fuzzy width matching, or both. Based on the choice of the first set of criteria, rectangles that exactly matches or fuzzily matches the rectangle members of the search pattern may be identified.

Figure 8A:
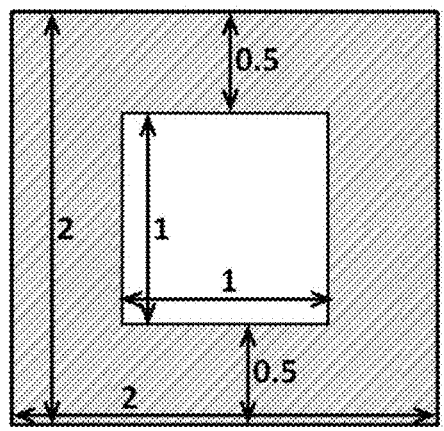
FIG. 8A illustrates an example of a symmetric search pattern 800.
Figure 8B:
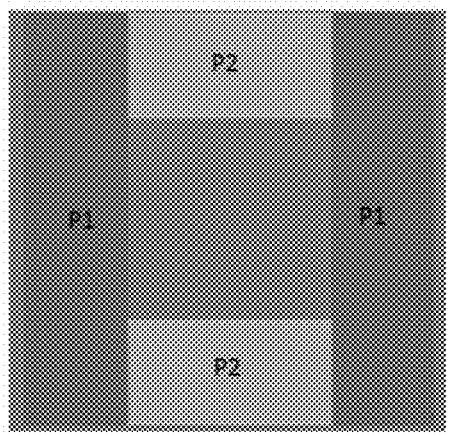
FIG. 8B illustrates one way to dissect the search pattern 800 into rectangles according to various embodiments of the disclosed technology.
Figure 8C:
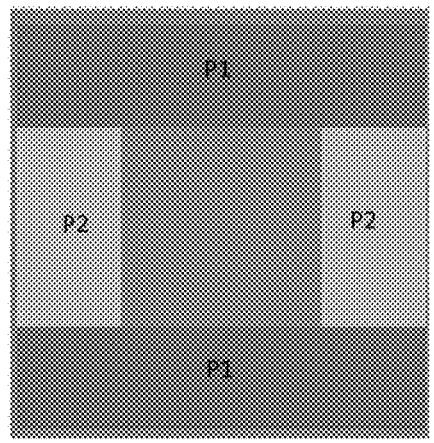
FIG. 8C illustrates another way to dissect the search pattern 800 into rectangles according to various embodiments of the disclosed technology.

For some search patterns, the matching rectangle identification unit 420 may employ an edge operation related to angles. FIG. 8A illustrates an example of such a search pattern. The search pattern 800 can be dissected in two different ways, as shown in FIG. 8B and FIG. 8C, respectively. Due to the symmetry of the search pattern 800, the same layout pattern may be identified as two instances of the search pattern 800 based on the edge operations described above. The Calibre family of software tools has an edge operation that takes three inputs (edges of polygons, angle constraint, angle value) and returns edges that meet the constraint: E'==ANGLE(E, R0, value). The commands for identifying the matching rectangles for the search pattern 800 may be written as:

P1_Len_1==ANGLE(LENGTH(Metal_1,==,2),==,0),
P1_Len_2==LENGTH(Metal_1,==,2),
P2_Len_1==ANGLE(LENGTH(Metal_1,==,2),==,0),
P2_Len_2==LENGTH(Metal_1,==,1),
P1==WIDTH(P1_Len_1,P1_Len_2,Metal_1,==,2),
P2==WIDTH(P2_Len_1,P2_Len_2,Metal_1,==,0.5).

Figure 9:
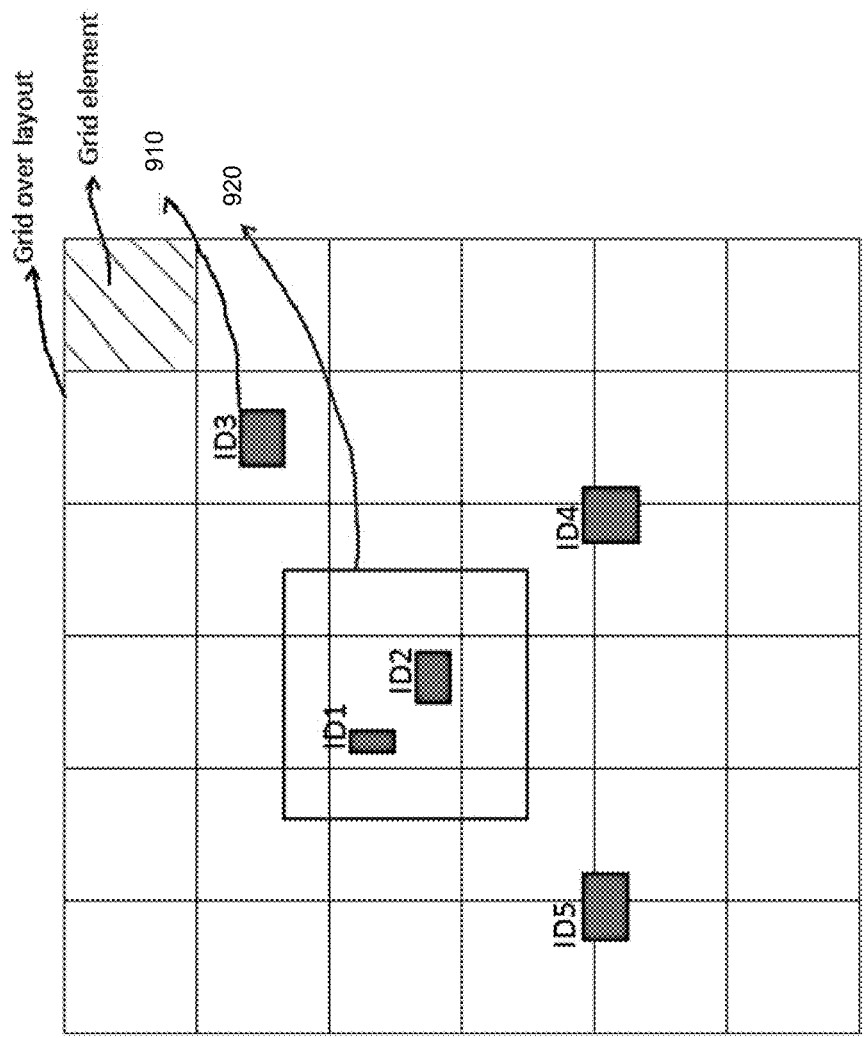
FIG. 9 illustrates an example of adding a grid over a layout.

In operation 540, the grid element identification value attaching unit 440 attaches grid element identification values to the matching rectangles. To facilitate finding objects, the layout design is divided by a regular grid into a number of equal rectangle regions (grid elements). It should be noted that the rectangle regions may be rectangle-shaped or square-shaped. The regular grid may have an adaptive structure: the grid element size of the regular grid can be adjusted such that the grid element size and size of a bounding box of the search pattern are comparable. FIG. 9 illustrates an example of adding a grid over a layout. Each rectangle member such as ID3 (910) is attached with one or more grid element identification values. Based on the grid element identification values, the matching rectangles that are neighbors of a particular matching rectangle can be easily determined.

In operation 560, the matching pattern determination unit 460 determines matching patterns in the layout design that match the search pattern based on a second set of criteria. The determining comprises analyzing the matching rectangles that match the reference rectangle members in neighborhoods of the matching rectangles that match the origin rectangle member. The neighborhoods are determined based on the grid element identification values. In another word, whether the matching rectangles that match the reference rectangle members are in the neighborhood of a particular matching rectangle that matches the origin rectangle member is determined based on the grid element identification values. Only those matching rectangles in the neighborhood will be analyzed to determine whether a matching pattern exists for the particular matching rectangle that matches the origin rectangle member.

The extent of the neighborhood may be defined by a bounding box for the search pattern like a square 920 shown in FIG. 9. The bounding box overlaps either entirely or partially with one of 3×3 grid elements. Only matching rectangles that match the reference rectangle members and have grid element identification values associated with the 3×3 grid elements will be analyzed. This is much faster than methods based on topological scan-lines. In a topological scan-line-based method, all of the matching rectangles may need to be checked.

The second set of criteria may comprise criteria for exact matching, fuzzy matching, partial matching, or any combinations thereof. One example is that a matching pattern is found if within the bounding box of a matching rectangle that matches the origin rectangle member there exists a matching rectangle that matches each of the reference rectangle members regardless of their exact locations.

Figure 10:
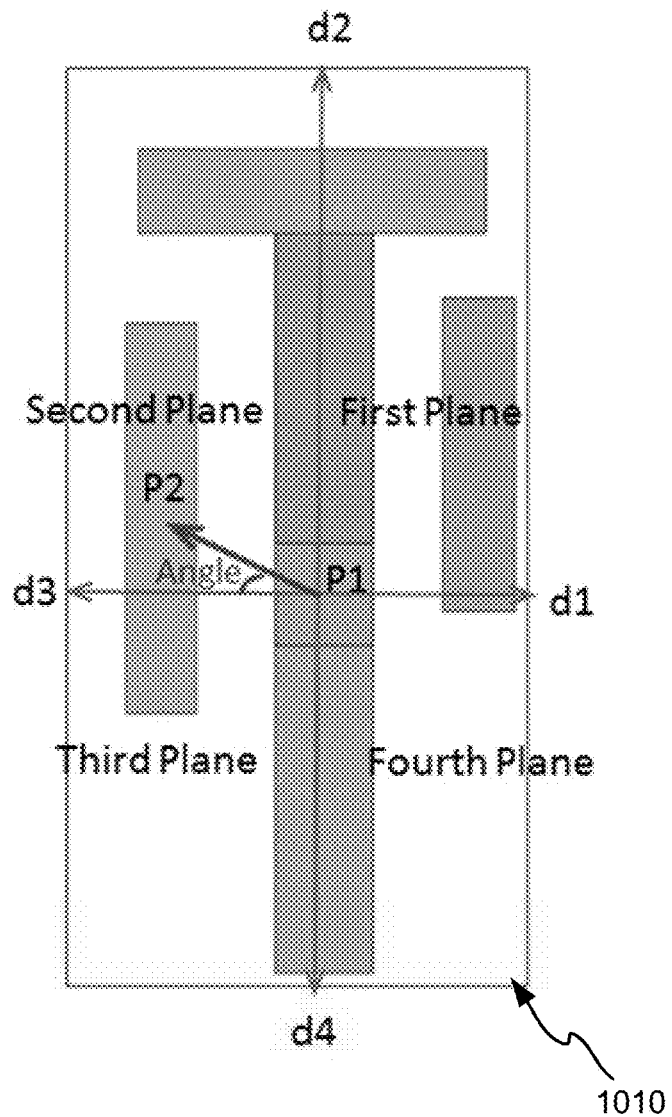
FIG. 10 illustrates an example of a bounding box for the search pattern 600.

FIG. 10 illustrates an example of a bounding box for the search pattern 600. The search pattern shown in FIG. 10 is the same as the pattern 600 shown in FIG. 6A and is dissected into rectangle members in the same way as in FIG. 6B. Here, P1 is designated as the origin rectangle member and P2 as the first reference rectangle member. It should be noted that other rectangle members may be selected as either the origin rectangle member or the first reference rectangle member.

Figure 11:
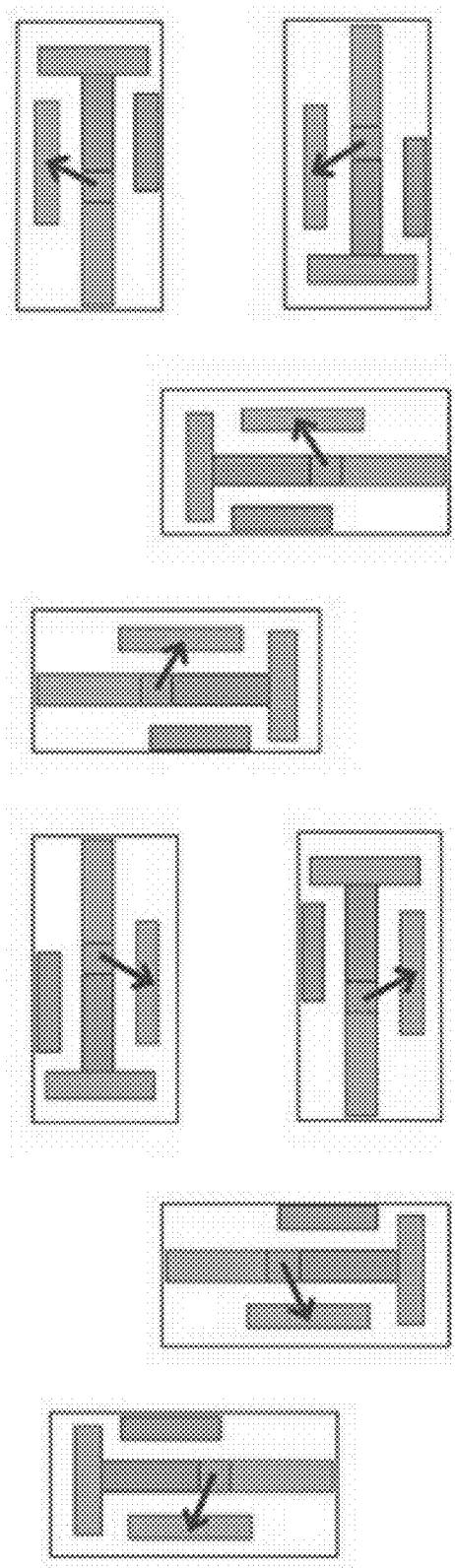
FIG. 11 illustrates eight different orientations (four rotations×two mirrored images) of the search pattern 600.

The distances (d1, d2, d3 and d4 shown in FIG. 10) between the center of the origin rectangle member and the bounding box alone cannot define the bounding box. This is because the search pattern may have different orientations. A vector pointing from the center point of the origin rectangle member P1 to the center point of the first reference rectangle member P2 may be used to address the issue. FIG. 11 illustrates eight different orientations (four rotations×two mirrored images) of the same search pattern 600. The arrow shown on each of the eight patterns represents the vector. The search pattern may be described as:

1) Vector information (angle and distance between the origin rectangle member and the first reference rectangle member);
2) Plane location of the first reference rectangle member (one of four planes or four along axis);
3) Distances between centers of rectangle members and the bounding box;
4) The width and the height; and
5) A Boolean to indicate whether a rectangle member is a width one or a space one.

The above information may be stored in a pattern description database (PDB).

Figure 13:
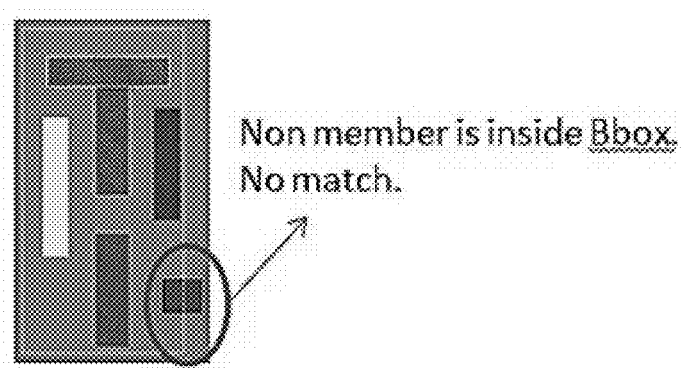
FIG. 13 illustrates an example of a pattern which is determined to be not a matching pattern due to the existence of a non-member.
Figure 14:
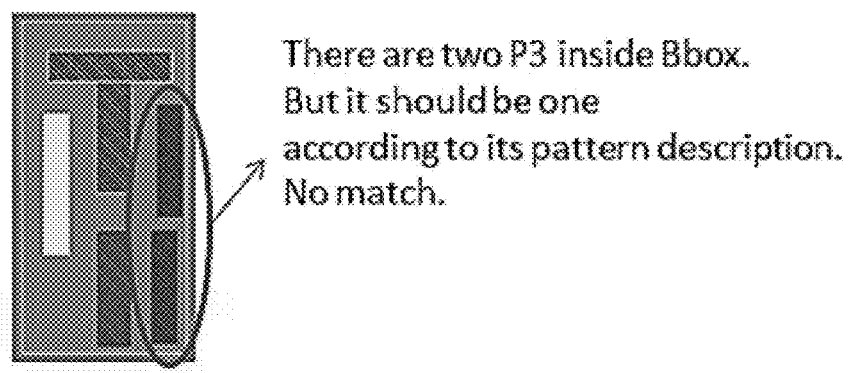
FIG. 14 illustrates an example of a pattern which is determined to be not a matching pattern due to the existence of an extra member.

FIG. 12 illustrates an example of a pattern matching algorithm for exact match that may be employed according to various embodiments of the disclosed technology. As indicated in the algorithm, non-members inside the pattern bounding box are first checked during the pattern matching process. If there is a non-member polygon inside the bounding box as shown in FIG. 13, it is immediately classified as no match. Another criterion for an early invalidation of a match is to analyze the total number of each member. If the number does not match inside the bounding box as shown in FIG. 14, it is classified as not a match right away. The orientation of the pattern is determined by calculating the vector (angle and distance) between P1 and the found P2 and referencing the information in the pattern description database.

Rectangular extents of geometric objects are used to insert into the grid. The grid is first populated with a series of ADD BIN methods. ADD BIN has a rectangle input along with an associated ID for the object. The grid can then be searched with the LOCATE BIN method. LOCATE BIN has a search rectangle as input, and returns a set of object IDs that interact with the rectangle. The bin-search grid has a fixed overall rectangular bounding box, usually layout extent, which is supplied by the client at initialization time. This rectangle is divided into a 2D grid with an initial default pixel size. ADD BIN and LOCATE BIN can then directly calculate the row and column elements of the grid to analyze using the pixel size. ADD BIN contains heuristics to decrease the pixel size and recalculate the grid when the number of bins in the grid elements becomes large.

LOCATE BIN analyzes the intersecting grid elements with a search rectangle and builds a list of unique bin IDs that have been previously added. The bin-search grid is efficient when the added bin extents, which are member rectangles in the present case, are small relative to the overall layout extent bounding box. Since pattern bounding box is, in general, so small relative to the layout extent that it lies in one grid element in our application. FIG. 9 explains it graphically. In this picture, bounding box has 3 by 3 grid elements to locate bins inside it. Because LOCATE BIN has $O(k)$ where k is the total number of grid elements overlapped by a search extent rectangle, it requires $O(9)$ to locate ID1 and ID2 bin.

Let n denote total number of P1 and let m denote total number of all members in a layout. Since a scan-line based algorithm visits all origin members in P1, it is $O(n)$ for the while loop. The scanline search to find other members inside the while loop requires m times topological check per each loop. Therefore, the complexity becomes $O(nm)$. Because of m>=n, we can say that $O(n(n+c))$ where c is a constant, and it becomes $O(n^2)$.

Those two steps are replaced with LOCATE BIN for the algorithm in FIG. 12. Since LOCATE BIN's time and other necessary information that is used to perform pattern matching complexity is $O(k)$ where k is the total number of grid elements overlapped by a search box, The algorithm in FIG. 12 has $O(nk)$. Because k<<n or k=1 in general in a pattern match process, it is $O(n)$ in practice. Accordingly, the algorithm in FIG. 12 is much faster than a scan-line based algorithm.

Figure 15:
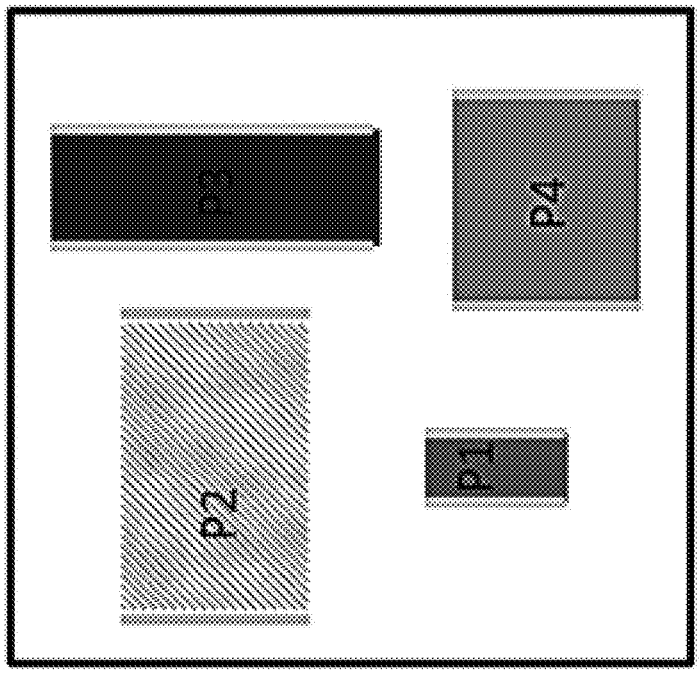
FIG. 15 illustrates an example of fuzzy pattern matching.

Fuzzy pattern matching can be implemented using the disclosed technology. FIG. 15 illustrates an example of fuzzy pattern matching. As seen in the figure, the rectangle members P1 and P2 are described using the relational operators => and =>. In this case, the number of each member inside bounding box may be used for fuzzy pattern match. FIG. 16 illustrates an example of a fuzzy pattern matching algorithm that may be employed according to various embodiments of the disclosed technology.

Figure 17A:
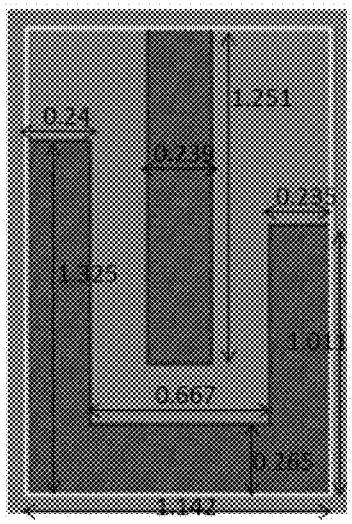
FIG. 17A illustrates a search pattern 1700.
Figure 17B:
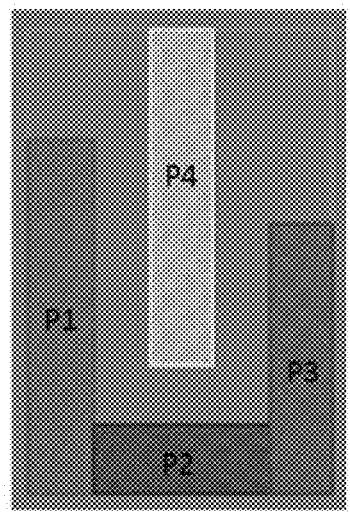
FIG. 17B illustrates the search pattern 1700 being divided into four rectangle members P1-P4 and an exact pattern description.

FIG. 17A illustrates a search pattern 1700. FIG. 17B illustrates the search pattern 1700 being divided into four rectangle members P1-P4 and an exact pattern description.

Figure 17C:
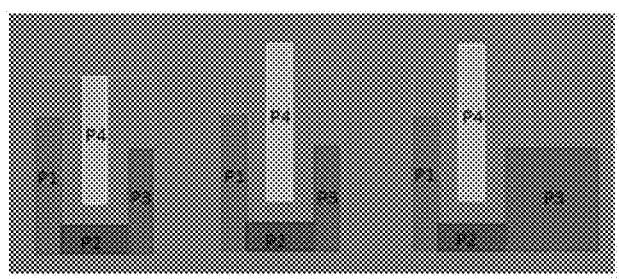
FIG. 17C illustrates a fuzzy pattern description and examples of matching patterns derived through a fuzzy match process.

FIG. 17C illustrates a fuzzy pattern description and examples of matching patterns derived through a fuzzy match process.

Partial pattern matching can also be implemented using the disclosed technology. By removing the check of non-member from the algorithm shown in FIG. 12, patterns that contain additional layout features will be determined as matching patterns. Matching for incompletely-specified patterns (i.e., not all of dissected rectangles need to be found) or pattern matching with "Don't care" regions can also be implemented with the disclosed technology.

The pattern matching tool 400 may store the determined matching patterns on a medium. The matching patterns may be represented by the bounding boxes.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. One or more non-transitory computer-readable media storing computer-executable instructions for causing one or more processors to perform a method, the method comprising:
    identifying matching rectangles in a layout design that match rectangle members of a search pattern based on edge operations and a first set of criteria, the layout design comprising data describing a mask or reticle for a plurality of microdevices to be formed on a single wafer, and the rectangle members comprising an origin rectangle member and one or more reference rectangle members;
    wherein the edge operations comprise identifying edges in the layout design that match respective edges of the rectangle members according to a first matching criterion in the first set of criteria;
    attaching grid element identification values to the matching rectangles, the grid element identification values being associated with a regular grid that divides the layout design into a number of equal rectangle regions (grid elements);
    determining first and second matching patterns in the layout design that match the search pattern based on a second set of criteria, the determining comprising analyzing those matching rectangles that match the one or more reference rectangle members in neighborhoods of respective first and second matching rectangles that match the origin rectangle member, wherein the neighborhoods are determined based on the grid element identification values;
    wherein the analyzing comprises comparing each of the one or more reference rectangle members with one or more of the those matching rectangles according to a second matching criterion of the second set of criteria, and wherein the first or second matching pattern is determined upon finding a matching one of the those matching rectangles for each of the one or more reference rectangle members; and
    storing the matching patterns, wherein the identifying, the attaching, the determining and the storing are part of a process of processing the layout design, a circuit design associated with the layout design, or both.

2. The one or more non-transitory computer-readable media recited in claim 1, wherein the edge operations are edge-based operations of a design rule checking (DRC) tool.

3. The one or more non-transitory computer-readable media recited in claim 1, wherein the second set of criteria comprise criteria for exact matching, fuzzy matching, partial matching, or any combinations thereof.

4. The one or more non-transitory computer-readable media recited in claim 1, wherein the regular grid is an adaptive grid.

5. The one or more non-transitory computer-readable media recited in claim 4, wherein size of the grid elements is adjusted to be comparable to size of a bounding box of the search pattern.

6. The one or more non-transitory computer-readable media recited in claim 1, wherein the determining comprises:
    identifying a first matching rectangle that not only matches one of the reference rectangle members but also has a distance from a second matching rectangle that matches the origin rectangle member the same as that of the search pattern;
    constructing a bounding box based on the first matching rectangle and the second matching rectangle; and
    determining whether the bounding box encloses the matching rectangles that match the rest of the reference rectangle members.

7. The one or more non-transitory computer-readable media recited in claim 1, wherein the edge operations further comprise comparison of width or spacing between pairs of identified edges in the layout design and the width or spacing between respective pairs of the matched edges of the rectangle members.

8. A method, executed by at least one processor of a computer, comprising:
    identifying matching rectangles in a layout design that match rectangle members of a search pattern based on edge operations and a first set of criteria, the layout design comprising data describing a mask or reticle for a plurality of microdevices to be formed on a single wafer, and the rectangle members comprising an origin rectangle member and one or more reference rectangle members;
    wherein the edge operations comprise identifying edges in the layout design that match respective edges of the rectangle members according to a first matching criterion in the first set of criteria;
    attaching grid element identification values to the matching rectangles, the grid element identification values being associated with a regular grid that divides the layout design into a number of equal rectangle regions (grid elements);
    determining first and second matching patterns in the layout design that match the search pattern based on a second set of criteria, the determining comprising analyzing those matching rectangles that match the one or more reference rectangle members in neighborhoods of respective first and second matching rectangles that match the origin rectangle member, wherein the neighborhoods are determined based on the grid element identification values;

wherein the analyzing comprises comparing each of the one or more reference rectangle members with one or more of the those matching rectangles according to a second matching criterion of the second set of criteria, and wherein the first or second matching pattern is determined upon finding a matching one of the those matching rectangles for each of the one or more reference rectangle members; and storing the matching patterns, wherein the identifying, the attaching, the determining and the storing are part of a process of processing the layout design, a circuit design associated with the layout design, or both.

9. The method recited in claim 8, wherein the edge operations are edge-based operations of a design rule checking (DRC) tool.

10. The method recited in claim 8, wherein the first set of criteria comprise criteria for exact matching, fuzzy matching, or both.

11. The method recited in claim 8, wherein the regular grid is an adaptive grid.

12. The method recited in claim 11, wherein size of the grid elements is adjusted to be comparable to size of a bounding box of the search pattern.

13. The method recited in claim 8, wherein the determining comprises:

identifying a first matching rectangle that not only matches one of the reference rectangle members but also has a distance from a second matching rectangle that matches the origin rectangle member the same as that of the search pattern;

constructing a bounding box based on the first matching rectangle and the second matching rectangle; and determining whether the bounding box encloses the matching rectangles that match the rest of the reference rectangle members.

14. The method recited in claim 8, wherein the edge operations further comprise comparison of width or spacing between pairs of identified edges in the layout design and the width or spacing between respective pairs of the matched edges of the rectangle members.

15. A system comprising:

one or more processors with memory coupled thereto, the one or more processors programmed to perform a method, the method comprising:

identifying matching rectangles in a layout design that match rectangle members of a search pattern based on edge operations and a first set of criteria, the layout design comprising data describing a mask or reticle for a plurality of microdevices to be formed on a single wafer, and the rectangle members comprising an origin rectangle member and one or more reference rectangle members;

wherein the edge operations comprise identifying edges in the layout design that match respective edges of the rectangle members according to a first matching criterion in the first set of criteria;

attaching grid element identification values to the matching rectangles, the grid element identification values being associated with a regular grid that divides the layout design into a number of equal rectangle regions (grid elements);

determining first and second matching patterns in the layout design that match the search pattern based on a second set of criteria, the determining comprising analyzing those matching rectangles that match the one or more reference rectangle members in neighborhoods of respective first and second matching rectangles that match the origin rectangle member, wherein the neighborhoods are determined based on the grid element identification values;

wherein the analyzing comprises comparing each of the one or more reference rectangle members with one or more of the those matching rectangles according to a second matching criterion of the second set of criteria, and wherein the first or second matching pattern is determined upon finding a matching one of the those matching rectangles for each of the one or more reference rectangle members; and storing the matching patterns, wherein the identifying, the attaching, the determining and the storing are part of a process of processing the layout design, a circuit design associated with the layout design, or both.

16. The system recited in claim 15, wherein the first set of criteria comprise criteria for exact matching, fuzzy matching, or both.

17. The system recited in claim 15, wherein the second set of criteria comprise criteria for exact matching, fuzzy matching, partial matching, or any combinations thereof.

18. The system recited in claim 15, wherein the regular grid is an adaptive grid.

19. The system recited in claim 15, wherein the determining comprises:

identifying a first matching rectangle that not only matches one of the reference rectangle members but also has a distance from a second matching rectangle that matches the origin rectangle member the same as that of the search pattern;

constructing a bounding box based on the first matching rectangle and the second matching rectangle; and determining whether the bounding box encloses the matching rectangles that match the rest of the reference rectangle members.

20. The system recited in claim 15, wherein the edge operations further comprise comparison of width or spacing between pairs of identified edges in the layout design and the width or spacing between respective pairs of the matched edges of the rectangle members.

* * * * *